MICRO-MINIATURE SEMICONDUCTOR DEVICES

Filed Feb. 9, 1962

INVENTORS.
HERBERT S. EVANDER,
KARL H. REISSMUELLER,
BY
W. H. [signature]
ATTORNEY.

3,202,888
Patented Aug. 24, 1965

3,202,888

MICRO-MINIATURE SEMICONDUCTOR DEVICES

Herbert S. Evander, Santa Ana, and Karl H. Reissmueller, Costa Mesa, Calif., assignors to Hughes Aircraft Company, Culver City, Calif., a corporation of Delaware Filed Feb. 9, 1962, Ser. No. 172,338
3 Claims. (Cl. 317—234)

This invention relates to semiconductor devices and to containers therefor. More particularly the invention relates to containers for packages of extremely small size for semiconductor devices such as diodes and transistors.

Many modern electronic systems have become so complex as to be quite weighty and of considerable size. There, therefore, has been a marked interest in reducing the volume and weight of the components for such systems. In the semiconductor device industry this effort has resulted in the production of extremely small devices and packages therefor. These small packages, of course, must be hermetically sealed in order to protect the operative device therein from contaminating atmospheres. Such a micro-miniaturized semiconductor device and package is shown and described in the co-pending application of William B. Warren, S.N. 861,276 filed Decmber 22, 1959 now Patent #3,168,687 and assigned to the instant assignee. In the Warren application the package disclosed is about 0.050 inch in diameter and about 0.030 inch in height. The package comprises essentially an electrically insulating envelope, preferably of ceramic material, with the semiconductor device being mounted in the envelope on a metallic end cap which is hermetically sealed to the envelope. The other end of the package is closed by hermetically sealing to the envelope another metallic cap which may be electrically isolated into two parts to provide separate connections as may be needed as when the device is a transistor, for example. In the case of a transistor the collector region may be provided on the surface of the crystal body adjacent the metal end cap to which the crystal body is affixed with the emitter and base regions being provided on the opposite surface. Several methods have been suggested for providing the electrical connections between the emitter and base regions and the parts of the two-part metallic cap on the other end of the package. One method is to weld, solder, or bond or otherwise fuse small wires to the metallic cap portions or to provide small holes in these metallic cap portions and thread the wires therein and fuse the wires in place. In either of these arrangements it is necessary to contact the emitter and base regions in the semiconductor crystal which regions are extremely small thus making it extremely difficult to accomplish these connections with precision, particularly at a high rate of production. The general procedure has been to connect these fine wires to these regions of the crystal by means of thermo-compression bonding techniques. As a typical example these connections require thermo-compression bonding wires about 0.007 inch in diameter to a base region about 0.002 inch in width and an emitter region of about 0.002 inch in diameter. It is then necessary to thread these fine wires into their respective openings in the metallic end portion of the package which openings are about 0.008 inch in diameter, for example. It will thus be appreciated that these procedures involve very difficult and time-consuming operations and can account for a large proportion of finished devices which are inoperative.

It is therefore an object of the present invention to provide an improved semiconductor device and package therefor.

A further object of the invention is to provide an improved semiconductor device and package therefor which does not require the attachment of fine wires or the like to different regions of the semiconductor device.

The invention will be described in greater detail by reference to the drawings in which.

Figure 1:
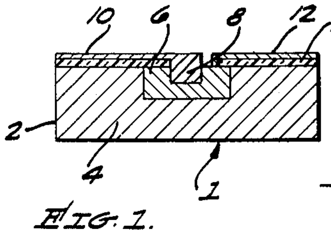
FIGURE 1 is a cross-sectional, elevational view of a semiconductor device according to the present invention.
Figure 2:
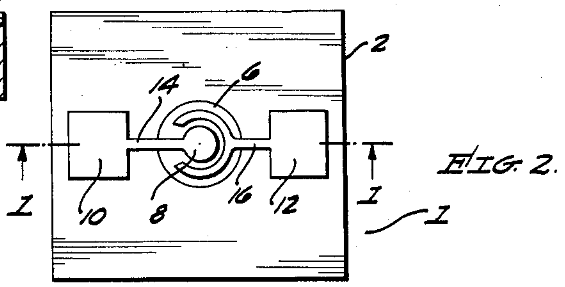
FIGURE 2 is a plan view of the semiconductor device shown in FIGURE 1.

Referring now to FIGURES 1 and 2, a semiconductor transistor device 1 is shown. The device comprises a crystalline semiconductor body 2, the bulk region 4 of which may constitute a collector region. One surface of the semiconductor body 2 is provided with a base region 6 concentrically disposed around an emitter region 8.

The structure shown in FIGURES 1 and 2 may be provided according to techniques described in the co-pending application of Israel Drukaroff and James O. McCaldin, S.N. 35,541, filed June 13, 1960 and assigned to the instant assignee. Such structures are formed by providing surfaces of a semiconductor wafer with an oxide masking coating thereon according to techniques taught by Derick et al. in U.S. Patent Number 2,802,760. This oxide mask is formed on the surface of the crystal body or wafer 2 except for the portions thereof whereat it is desired to form the base region 6. A conductivity-type-determining material is then diffused onto the exposed wafer surface after which all but a central portion of this diffused region is again masked with an oxide layer and a different conductivity-type-determining impurity is diffused onto the exposed portion to form the emitter region 8. As a typical example, the bulk portion 4 of a semiconductor body 2 may be of N-type conductivity as provided by a donor impurity such as arsenic; a base region may be of P-type conductivity as provided by an acceptor impurity such as boron which may be readily diffused into the crystal body; the emitter region 8 may be of N-type conductivity as provided by a donor impurity such as arsenic or phosphorous which may be readily diffused therein. The establishment of such regions of different conductivity types by diffusion techniques, is well known in the art and need not be further described. While the establishment of an N-P-N semiconductor structure has been described, alternate conductivity areas may likewise be established to provide a P-N-P device. Alternate geometric electrode areas other than the typical concentrically disposed areas described herein may also be employed as is well known in the art.

According to the present invention an additional mask, which may be a removable metal template for example, is placed over the surface of the semiconductor body 2 containing the emitter and base regions. An electrically conductive material such as aluminum, for example, may then be evaporated and deposited through the template and on the surface of the crystal body to form relatively large area contact portions 10 and 12 which are well away from the base and emitter regions 6 and 8 respectively. By the same masking and deposition process the conductive material is also deposited on the emitter region 8 and on the base region 6 and stripe-wise on the surface of the crystal body 2 so as to provide electrical connection between these regions and the large area contact portions 10 and 12. It is preferred to leave the oxide coating employed during the diffusion process mentioned previously, in place on the crystal body surface so as to provide electrical insulation between the semiconductor body 2 and the large area contact portions 10 and 12 and the connecting strips 14 and 16 to the emitter and base regions. This oxide coating is shown in FIGURE 1 as the layer 18 immediately beneath the conductive layers 10 and 12.

Figure 3:
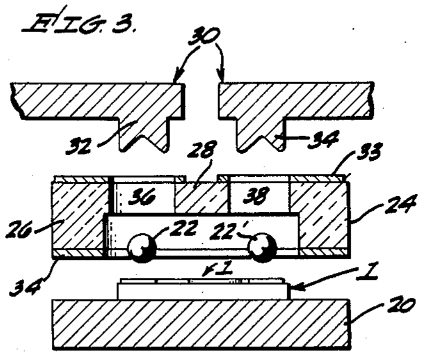
FIGURE 3 is a cross-sectional, exploded, elevational view of a semiconductor device and package therefor according to the present invention.
Figure 4:
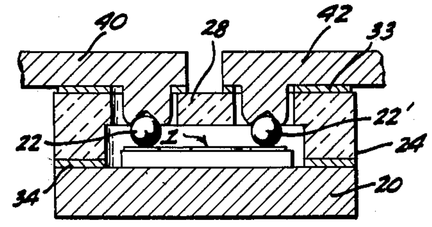
FIGURE 4 is a cross-sectional, elevational view of a semiconductor device completely sealed within a container according to the present invention.

Referring now to FIGURE 3 the transistor device is mounted on an electrically conductive plate 20 which may be of metal such as a nickel-iron alloy or molybdenum for example. The semiconductor body 2 may be fused to the plate 20 so as to provide a good ohmic connection between the collector region 4 and the plate 20 (which may also be referred to as the collector terminal cap or plate). Thereafter spheres 22, 22' of electrically conductive material, which likewise may be of metal such as a gold alloy, are placed in position on the large area contact portions 10 and 12 of the semiconductor body 2. An envelope member 24 of electrically insulating material, having wall portions 26 and an end portion 28 integral therewith, is then placed on the conductive plate 20 so as to surround and contain therewithin the semiconductor device 1. The electrically insulating envelope member 24 may be cylindrically shaped and of ceramic material, for example. The ends of the envelope member 24 may be metalized in accordance with conventional ceramic metalizing procedures to provide metalized regions 33 and 34 thereon to permit the hermetic sealing of these end portions to the plate 20 and to an upper plate member 30. The upper plate member 30 may be of one-piece construction at this stage of assembly and is provided with small extensions or prongs 32 and 34 inserted down into passageways 36 and 38 in the electrically insulating end portion 28 of the envelope member 24. The ends of the prongs 32 and 34 may be provided with a concave shape so as to facilitate indexing and positioning the electrically conductive spheres 22 and 22' therein and thereagainst. When the one-piece combination cap and lead member 30 has been properly positioned, the device may then be heated whereby to achieve the sealing of the plate 20 and the one-piece cap member 30 to the insulating member 24. During the same time the spheres 22 and 22' may be fused to the large area contact portions 10 and 12 and to the extensions 32 and 34 of the cap member 30. A completely sealed device is shown in FIGURE 4. Electrical insolation between connections from the one-piece cap member 30 to the emitter and base regions is then achieved by cutting the one-piece cap member 30 to form separate cap end lead connections 40 and 42. This electrical isolation may alternately be shown for providing the desired connections to the regions achieved prior to the sealing of the device, if desired.

Figure 5:
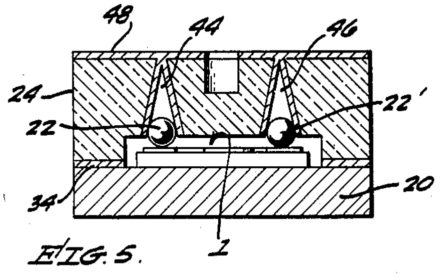
FIGURE 5 is a cross-sectional elevational view of a semiconductor device completely sealed in another embodiment of a container therefor, according to the present invention.

Referring now to FIGURE 5, an alternate structure is on the surface of the semiconductor body 2. In this embodiment, conical shaped passageways 44 and 46 are provided in the electrically insulating end section 28 of the container 24. These conically shaped passageways 44 and 46 are provided with electrically conductive surfaces as by metalizing the surfaces of the passageways by techniques well-known in the art. The electrically insulating envelope 24 is then again hermetically sealed to the lower plate 20 as described previously during which sealing operation the electrically conducting bodies 22 and 22' likewise are fused to the large area contact portions 10 and 12 on the semiconductor body surface and to the electrically conductive surfaces of the passageways 44 and 46. The exterior surface of the end section 28 may by provided with a metalized surface 48, again by known metalizing procedures, so as to be in electrically conductive relationship with the electrically conductive surfaces of the passageways 44 and 46. Alternatively, a terminal plate may be employed instead of the metalized layer 48 which plate may be also hermetically sealed to the electrically insulating end section 28. Again isolation between connections to the different regions is provided by cutting the metalized layer or plate 48 between the passageways 44 and 46 as shown.

Figure 6:
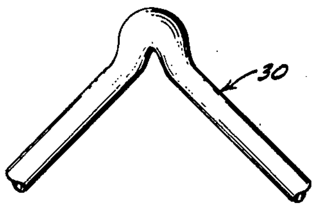
FIGURE 6 is a plan view of a combination package cap and lead-connector in an initial step of the formation thereof.
Figure 7:
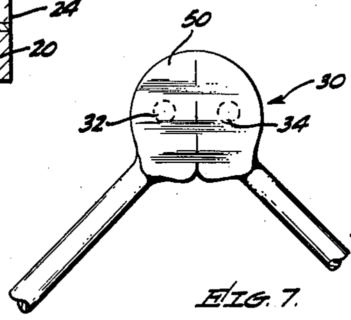
FIGURE 7 is a plan view of the combination package cap and lead-connector of FIGURE 6 in a subsequent step of formation and as ready to be employed in connection with the package of FIGURE 4.

FIGURES 6 and 7 illustrate the formation of the one-piece cap end lead-connection member 30 utilized in connection with the embodiment of the invention shown in FIGURES 3 and 4. In FIGURE 6 a wire having essentially a 90 degree bend therein is shown. The area of the bend is then flattened or stamped so as to form a flat portion 50 as shown in FIGURE 7. At the same time this stamping operation may be utilized to form the extensions or prongs 32 and 34.

There thus has been described a novel and extremely advantageous method of providing an extremely small semiconductor device in a similarly small hermetically sealed package which greatly facilitates the assembly and manufacture and avoids many tedious and time-consuming operations characteristic of prior art devices so packaged.

What is claimed is:

1. A semiconductor device comprising: a semiconductor crystal body having on a first surface thereof small area junction-forming regions and large area contact portions electrically connected respectively to said small area regions and insulated from said semiconductor body said regions and said contact portions being disposed on different areas of said first surface of said body; a container for said semiconductor body having electrically insulated wall portions, an electrically insulating end portion having passageways therethrough, and an electrically conductive end portion hermetically sealed to said wall portions; said semiconductor body being mounted on said electrically conductive end portion with a second surface thereof in electrically conductive relationship therewith; lead means disposed on the exterior of said electrically insulating end portion and having extensions hermetically sealed in said passageways of said electrically insulating end portion, electrically conductive connector members disposed between said large area contact portions and said extensions of said lead means, the ends of said extensions having a concave shape whereby said connector members are indexed and positioned in contact therewith.

2. A semiconductor device comprising: a semiconductor crystal body having a junction-forming region and an electrically conductive contact portion connected thereto and insulatingly disposed on a first surface of said body, said region and said contact portion being disposed on different areas of said first surface of said body; a container for said semiconductor body having electrically insulated wall portions, and electrically insulating end portion having at least one conically shaped passageway thereto, and an electrically conductive end portion hermetically sealed to said wall portions; said semiconductor body being mounted on said electrically conductive end portion with a second surface thereof in electrically conductive relationship therewith; said conically shaped passageway having an electrically conductive surface electrically connected to lead means outside of said container, and an electrically conductive connector member disposed between and in contact with said electrically conductive contact portion and said conductive surface of said conically shaped passageway.

3. The invention according to claim 2 wherein said electrically conductive connector member is fused in said conically shaped passageway in said insulating end portion, and to said electrically conductive contact portion on said first surface of said body.

References Cited by the Examiner

UNITED STATES PATENTS

| | | | |
|---|---|---|---|
| 2,728,881 | 12/55 | Jacobi | 317—235 |
| 2,981,877 | 4/61 | Noyce | 317—235 |
| 2,989,669 | 6/61 | Lathrop | 317—235 X |
| 3,059,158 | 10/62 | Doucette et al. | 317—234 |

DAVID J. GALVIN, *Primary Examiner.*

JAMES D. KALLAM, *Examiner.*

UNITED STATES PATENT OFFICE

CERTIFICATE OF CORRECTION

Patent No. 3,202,888 August 24, 1965

Herbert S. Evander et al.

It is hereby certified that error appears in the above numbered patent requiring correction and that the said Letters Patent should read as corrected below.

Column 1, line 57, for "0.007" read -- 0.0007 --; column 3, line 68, for "insolation" read -- isolation --; line 73, strike out the upside down line reading " shown for providing the desired connections to the regions" and insert the same after "structure is" in line 75, same column 3; column 4, line 15, for "may by" read -- may be --.

Signed and sealed this 15th day of March 1966.

(SEAL)
Attest:

ERNEST W. SWIDER
Attesting Officer

EDWARD J. BRENNER
Commissioner of Patents